United States Patent
Jain et al.

(10) Patent No.: US 12,294,372 B2
(45) Date of Patent: *May 6, 2025

(54) LOW POWER CRYSTAL OSCILLATOR WITH AUTOMATIC AMPLITUDE CONTROL

(71) Applicant: STMicroelectronics International N.V., Geneva (CH)

(72) Inventors: Nitin Jain, Greater Noida (IN); Anand Kumar, Noida (IN); Kallol Chatterjee, Kolkata (IN)

(73) Assignee: STMicroelectronics International N.V., Geneva (CH)

( * ) Notice: Subject to any disclaimer, the term of this patent is extended or adjusted under 35 U.S.C. 154(b) by 48 days.

This patent is subject to a terminal disclaimer.

(21) Appl. No.: 18/323,998

(22) Filed: May 25, 2023

(65) Prior Publication Data

US 2023/0412155 A1    Dec. 21, 2023

Related U.S. Application Data

(60) Provisional application No. 63/350,101, filed on Jun. 8, 2022.

(51) Int. Cl.
*H03K 3/03* (2006.01)
*H03K 3/012* (2006.01)
*H03K 3/354* (2006.01)

(52) U.S. Cl.
CPC .......... *H03K 3/0307* (2013.01); *H03K 3/012* (2013.01); *H03K 3/3545* (2013.01)

(58) Field of Classification Search
CPC ........................................................ H03K 3/73
USPC ............................................................ 331/160
See application file for complete search history.

(56) References Cited

U.S. PATENT DOCUMENTS

| | | | |
|---|---|---|---|
| 4,956,618 | A | 9/1990 | Ulmer |
| 5,805,027 | A | 9/1998 | Yin |
| 6,657,506 | B1 * | 12/2003 | Maheshwari ......... H03B 5/364 |
| | | | 331/109 |
| 6,784,757 | B2 | 8/2004 | Sibrai et al. |
| 7,098,753 | B1 | 8/2006 | Dumitrescu et al. |
| 7,262,671 | B2 | 8/2007 | Maeder |
| 7,688,154 | B1 | 3/2010 | Fotouhi |
| 8,922,287 | B2 | 12/2014 | Vilas Boas et al. |
| 9,461,584 | B2 | 10/2016 | Mittal et al. |
| 10,848,102 | B2 | 11/2020 | Zhang |
| 10,931,232 | B2 | 2/2021 | van der Zee et al. |

(Continued)

*Primary Examiner* — Joseph Chang
(74) *Attorney, Agent, or Firm* — Seed IP Law Group LLP (57) ABSTRACT

A low power crystal oscillator circuit has a high power part and a low power part. Crystal oscillation is initialized using the high power part. An automatic amplitude control circuit includes a current subtractor that decreases current in the high power part as an amplitude of the crystal oscillation increases. A current limiting circuit may limit current in the low power part in order to further reduce power consumption by the low power crystal oscillator circuit. Additionally, an automatic amplitude detection circuit may turn off the high power part after the amplitude of the crystal oscillation reaches a predetermined level in order to further reduce power consumption of the low power crystal oscillator circuit, and may turn back on the high power part after the amplitude of the crystal oscillation reaches a second predetermined level in order to maintain the crystal oscillation.

19 Claims, 8 Drawing Sheets

(56) References Cited

U.S. PATENT DOCUMENTS

| | | |
|---|---|---|
| 2006/0119447 A1* | 6/2006 | Hagino ................ H03K 3/0307 |
| | | 331/158 |
| 2009/0096541 A1 | 4/2009 | Tran |
| 2011/0148533 A1 | 6/2011 | Ramet |
| 2012/0161889 A1 | 6/2012 | Ozawa et al. |
| 2012/0326794 A1 | 12/2012 | Kammula |
| 2015/0214955 A1 | 7/2015 | Calhoun et al. |
| 2017/0346442 A1 | 11/2017 | Ito et al. |
| 2018/0054163 A1 | 2/2018 | Chen et al. |
| 2018/0109264 A1 | 4/2018 | Kim |
| 2021/0273610 A1 | 9/2021 | Telstø |
| 2023/0090782 A1 | 3/2023 | Kumar et al. |

\* cited by examiner

LOW POWER CRYSTAL OSCILLATOR WITH AUTOMATIC AMPLITUDE CONTROL

BACKGROUND

Technical Field

The present disclosure relates to an electrical circuit that drives a crystal that outputs an oscillating signal, and in particular, a crystal circuit that has low power consumption while outputting stable frequency during long term operation.

Description of the Related Art

The present disclosure relates to crystal oscillator circuitry that is used in applications where having low power consumption is a priority. For example, some devices are battery powered and may be placed in remote locations for a long period of time. Even when in sleep mode, the crystal oscillator will usually be outputting a stable frequency for those few circuits that operate in sleep mode.

Crystal oscillators operate by exciting a crystal through a harmonic circuit that usually comprises a resistor, a capacitor, and a transistor. Some circuits are also constructed to provide a negative resistance, while others operate based on different principles. For those that use negative resistance, it is established by the transconductance of the transistor. The more the transconductance, the more stable the crystal oscillator operates. However, the more the transconductance, the more current the transistor consumes, and the more power the oscillator circuit consumes.

To reduce power consumption, a low transconductance is required to stably operate a crystal oscillator. However, as the power consumption goes lower, there is a smaller tolerance for errors and the circuit is more susceptible to failure.

BRIEF SUMMARY

A low power crystal oscillator circuit according to the current disclosure includes a crystal electrically coupled with a resistor, first and second capacitors, and a first transistor forming an oscillator. The crystal is further electrically coupled to a first set of current mirror transistors and a second set of current mirror transistors. A first one of the first set of current mirror transistors receives a current having a relatively high magnitude. A second one of the first set of current mirror transistors provides an amplified version of the current having the relatively high magnitude to the first transistor for starting oscillation and maintaining of the crystal. A first one of the second set of current mirror transistors receives a current having a relatively low magnitude. A second one of the second set of current mirror transistors provides an amplified version of the current having the relatively low magnitude to the first transistor for maintaining oscillation of the crystal.

A third one of the second set of current mirror transistors is configured to subtract current from the first one of the first set of current mirror transistors, which reduces the current flowing in the second one of the first set of current mirror transistors. The third one of the second set of current mirror transistors is initially biased with very small (negligible) current. The gate terminal of the third one of the second set of current mirror transistors is electrically coupled to an input terminal or an output terminal of the crystal. As amplitudes starts growing, the current flowing through the third one of the second set of current mirror transistors increases, which reduces the current in the first set of current mirror transistors. Simultaneously with increasing amplitudes, additional transconductance to sustain oscillation of the crystal is provided by the second one of the second set of current mirror transistors.

A current limiting circuit may limit the current provided by the second set of current mirror transistors to drive the crystal. For example, the current limiting circuit may include a third set of current mirror transistors. A first one of the third set of current mirror transistors receives a current having a relatively low magnitude. A second one of the third set of current mirror transistors provides an amplified version of the current having the relatively low magnitude to the second one of the second set of transistors, which provides current to the first transistor for maintaining oscillation of the crystal. Accordingly, the second one of the second set of transistors does not cause positive feedback if the voltage at the input terminal of the crystal become large. In addition, after stable oscillation of the crystal is achieved, an automatic amplitude detection circuit may cause the second one of the first set of current mirror transistors to stop providing the amplified version of the current having the relatively high magnitude to the first transistor that drives oscillation of the crystal in order to further reduce power consumption.

DETAILED DESCRIPTION

Figure 1:
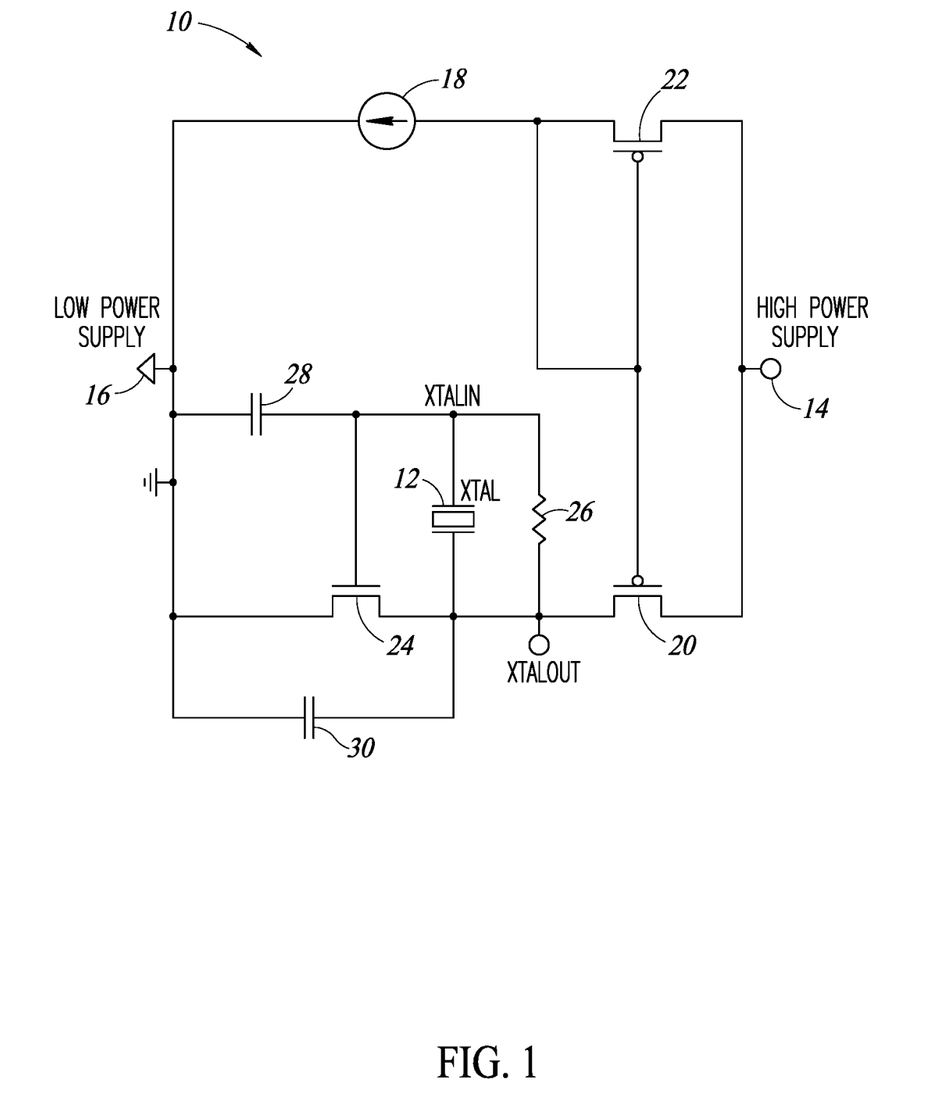
FIG. 1 shows a crystal oscillator circuit.

FIG. 1 shows a currently well-known crystal oscillator circuit 10 having a crystal 12 having an input terminal XTALIN and an output terminal XTALOUT. The circuit includes a current source 18 electrically coupled to a terminal of a current mirror transistor 20 that is electrically coupled to a second current mirror transistor 22. The second current mirror transistor 22 supplies a current that is a multiple of the current source 18 to drive a transistor 24. A resistor 26 is electrically coupled in parallel to the crystal 12. A first capacitor 28 is electrically coupled between the crystal 12 and ground or low power supply 16. A second capacitor 30 is electrically coupled between the crystal and ground.

In order to make the crystal oscillator circuit 10 work, necessary negative resistance must be provided to compensate for the equivalent series resistance (ESR) of the crystal 12. In order to guarantee high enough negative resistance, the transconductance has to be large enough, which requires a large bias current. While the negative resistance is need only at the frequency of oscillation, the crystal oscillator circuit 10 is biased in DC condition also to have negative resistance even at direct current (DC).

The transistor 24 provides transconductance to start and maintain oscillation of the crystal. The resistor 26 is a bias resistor. The first capacitor 28 and the second capacitor 30 provide harmonic resonance to maintain crystal oscillation. An output signal is measured at the crystal output terminal XTALOUT. To maintain crystal oscillation, the transistor 24 must be operated to provide negative resistance. The higher the value of transconductance, the more stable the oscillator circuit operates. There exists a minimum acceptable value of transconductance for which a crystal oscillator is stable. However, the higher the value of transconductance the higher the current transistor 24 requires, resulting in higher power consumption.

The present disclosure is directed to providing an oscillating circuit that increases the effective value of transconductance without increasing current consumption.

Figure 2:
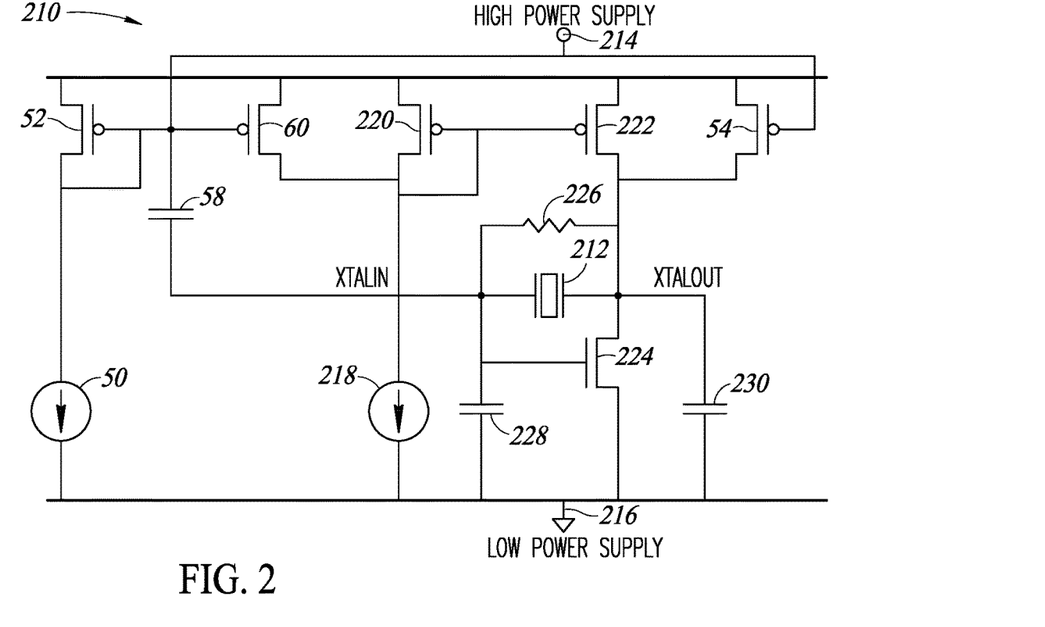
FIG. 2 shows a low power crystal oscillator circuit according to a first embodiment of the present disclosure.

FIG. 2 shows a low power crystal oscillator circuit 210 according to a first embodiment of the present disclosure. The low power crystal oscillator circuit 210 includes a crystal 212 having an input terminal XTALIN and an output terminal XTALOUT, a high power supply 214, a low power supply 216, a current source 218, a current mirror transistor 220, a current mirror transistor 222, a transistor 224, a bias resistor 226 electrically coupled in parallel with the crystal 212, a capacitor 228, and a capacitor 230.

The current mirror transistor 220 has a first terminal, a second terminal, and a gate terminal, wherein the first terminal of transistor 220 is electrically coupled to the high power supply 214, the second terminal of transistor 220 is electrically coupled to the current source 218, and the gate terminal of transistor 220 is electrically coupled to the second terminal of transistor 220. The current source 218 will ensure that a selected current as provided by the current source 218 passes through the current mirror transistor 220. In one embodiment, a current of 1.0 nA is provided by the current source 218.

The current mirror transistor 222 has a first terminal, a second terminal, and a gate terminal, wherein the first terminal of transistor 222 is electrically coupled to the high power supply 214, the second terminal of transistor 222 is electrically coupled to the output terminal XTALOUT of the crystal 212, and the gate terminal of transistor 222 is electrically coupled of transistor 222 to the gate terminal of the current mirror transistor 220. A transistor 224 has a first terminal, a second terminal, and a gate terminal, wherein the first terminal of transistor 224 is electrically coupled to the output terminal XTALOUT of the crystal 212, the second terminal of transistor 224 is electrically coupled to the low power supply 216, and the gate terminal of transistor 224 is electrically coupled to the input terminal XTALIN of the crystal 212. A first capacitor 228 is electrically coupled between the input terminal XTALIN of the crystal 212 and the low power supply 216. A second capacitor 230 is electrically coupled between the output terminal XTALOUT of the crystal 212 and the low power supply 216. The first capacitor 228 and second capacitor 230 provide harmonic resonance to maintain oscillation of the crystal 212.

The current mirror transistor 222 supplies a current that is a multiple of the current source 218 to output terminal XTALOUT of the crystal 212, in order to drive the transistor 224. The amount of current passing through the current mirror transistor 222 is amplified from the current through current source 218 based on the ratio of the W/L of transistor 222 to the W/L of transistor 220. By making the W/L of transistor 222 larger than the W/L of transistor 220, the amount of current used to drive the crystal 212 can be larger than the value of the current source 218 by some selected amount. In various embodiments, the current supplied by the current mirror transistor 222 is in the range of 20 to 250 times greater than the current supplied by the current mirror transistor 220. In an embodiment, the value of the width to length ratio of the current mirror transistor 220 is X, and the value of the width to length ratio of the current mirror transistor 220 is 200X. In an embodiment, the value of the width to length ratio of the transistor 224 is independent of the values of the width to length ratios of the transistors 220 or 222.

The low power crystal oscillator circuit 210 further includes a current source 50, a current mirror transistor 52, a current mirror transistor 54, a capacitor 58, and a current mirror transistor 60. The current source 50 will ensure that a selected current as provided by the current source passes through the transistor 52. In one embodiment, a current of 1.0 pA is provided by the current source 50. In an embodiment, the value of the width to length ratio of the transistor 224 is X. The value of current source 50 is much lower than the value of current source 218 that is used to start oscillation of the crystal 212. In one embodiment, the value of current source 50 is five times lower than the value of current source 218, therefore, after the crystal 212 has been started in proper operation using the larger current based on the current source 218.

At startup, the transistor 60 draws a small amount of current from the transistor 220, which is supplied by the current source 218, so that a good amount of current flows through the transistor 220 thereby causing a sufficient startup current to be provided through the transistor 222 to the pierce oscillator core, which includes the transistor 224, the capacitor 228, and the capacitor 230. After oscillator startup, the current through the transistor 60 starts increasing due to large oscillations at its gate through the capacitor 58 from the input terminal XTALIN of the crystal 212 due to nonlinear characteristics of the transistor 60, which results in the transistor 60 drawing more current from the transistor 220 thereby reducing the current flowing in the transistor 220. Oscillations are sustained by the current provided from the transistor 54.

The current mirror transistor 52 has a first terminal, a second terminal, and a gate terminal, wherein the first terminal of transistor 52 is electrically coupled to the high power supply 214, the second terminal transistor 52 is electrically coupled to the current source 50, and the gate terminal of transistor 52 is electrically coupled to the second terminal of transistor 52. The current mirror transistor 54 has a first terminal, a second terminal, and a gate terminal, wherein the first terminal of transistor 54 is electrically coupled to the high power supply 214, the second terminal of transistor 54 is electrically coupled to the second terminal of transistor 222, and the gate terminal of transistor 54 is electrically coupled to the gate terminal of transistor 60. In one or more implementations, a resistor and a capacitor are provided between transistor 52 and transistor 60.

The amount of current passing through the current mirror transistor 54 is amplified from the current through current source 50 based on the ratio of the W/L of transistor 54 to the W/L of transistor 60 or 52. By making the W/L of transistor 54 larger than the W/L of transistor 52, the amount of current used to drive the crystal 212 can be larger than the value of the current source 50 by some selected amount. In various embodiments, it might be in the range of 2 to 10 times greater. For example, the W/L of transistor 54 is 4.5 times larger than the W/L of transistor 52.

The current mirror transistor 60 has a first terminal, a second terminal, and a gate terminal, wherein the first terminal of transistor 60 is electrically coupled to the high power supply 214, the second terminal of transistor 60 is electrically coupled to the second terminal of transistor 220, and the gate terminal of transistor 60 is electrically coupled to the gate terminals of transistors 52 and 54. The current mirror transistor 60 is electrically coupled to the current mirror transistor 220 and the current source 218 such that the current provided by current source 218, which has a constant value, is equal to the current flowing through transistor 60 plus the current flowing through transistor 220. Thus, the current flowing through the transistor 220 is equal to the current provided by current source 218 minus the current flowing through transistor 60. Accordingly, as the current flowing through the transistor 60 increases due to an oscillation amplitude increase at the input terminal XTALIN of the crystal 212, the current flowing through the transistor 220 decreases. As a result, the current flowing through the transistor 222, which is a multiple of the current flowing through the transistor 220, also decreases. The decreased current flowing through the transistor 222 flows through the transistor 224 thereby reducing power consumption by the low power crystal oscillator circuit 210.

The amount of current passing through the current mirror transistor 60 is amplified from the current through current source 50 based on the ratio of the W/L of transistor 60 to the W/L of transistor 50. By making the W/L of transistor 52 larger than the W/L of transistor 60, the amount of current subtracted from the current flowing through transistor 220 can be smaller than the value of the current source 50 by some selected amount. In various embodiments, it might be in the range of 2 to 10 times smaller. For example, the W/L of transistor 52 is 5 times larger than the W/L of transistor 60.

The capacitor 58 couples the gate terminals of the current mirror transistors 52, 54, and 60 to the input terminal XTALIN of the crystal 212, which is also electrically coupled to the gate terminal of transistor 224 and the first capacitor 228 that provides harmonic resonance to maintain oscillation of crystal 212. While the crystal 212 is oscillating, the capacitor 58 provides a sinusoidal voltage signal to the gate terminals of the current mirror transistors 52, 54, and 60. The sinusoidal voltage signal is added to the average bias voltage provided by current mirror transistor 52, which is in a diode-connected configuration. The amount of current flowing through the current mirror transistors 54 and 60 varies according to the voltage at the gate terminals of transistors 54 and 60, respectively, which varies based on the sinusoidal voltage signal provided by the capacitor 58.

When power is initially supplied the low power crystal oscillator circuit 210, there is no oscillation of the crystal 212 and a DC signal flows through current mirror transistor 50, which is mirrored to the current mirror transistors 54 and 60. Once oscillation of the crystal 212 begins, the gates terminals of the current mirror transistors 54 and 60 receive the sinusoidal voltage signal provided by the capacitor 58. The sinusoidal voltage signal provided by the capacitor 58 is added to the average bias voltage provided by current mirror transistor 52.

As the voltage at the gates terminal of transistor 60 varies due to the sinusoidal voltage signal provided by the capacitor 58, the current mirror transistor 60 does not completely turn on or off. The current mirror transistor 60 is operated in its large signal range (nonlinear exponential or square law characteristics), which causes the average current in the current mirror transistor 60 to increase and thus causes the current flowing through transistor 220 to decrease. The current flowing through current mirror transistor 220 is multiplied and mirrored in the current mirror transistor 222. The current flowing through current mirror transistor 222 is provided to the transistor 224 to generate transconductance for starting and driving oscillation of the crystal 212. As the voltage at the input terminal XTALIN and the output terminal XTALOUT increases, the current mirror transistor 60 causes negative feedback that reduces the current flowing through transistor 224, which reduces power consumption by the low power crystal oscillator circuit 210. Accordingly, the amplitude of the current flowing through transistor 224 is automatically controlled to reduce power consumption in the low power crystal oscillator circuit 210.

The current mirror transistor 54 also supplies current to the transistor 224 to provide transconductance for maintaining oscillation of the crystal 212. The gate terminal of current mirror transistor 54 also receives the sinusoidal voltage signal provided by the capacitor 58. As the amplitude of oscillation of the crystal 212 increases, the sinusoidal voltage signal provided by the capacitor 58 causes the voltage at the gate terminal of transistor 54 to increase, which causes the current mirror transistor 54 to supply more current to the transistor 224. If there is a relatively large voltage at the input terminal XTALIN of the crystal 212, there is a corresponding increase in the sinusoidal voltage signal provided by the capacitor 58, and the current mirror transistor 54 causes undesirable positive feedback resulting in a relatively large current flowing through the transistor 224. In order to prevent such positive feedback, a current limiting circuit may be added to limit the current flowing through the current mirror transistor 54.

Figure 3:
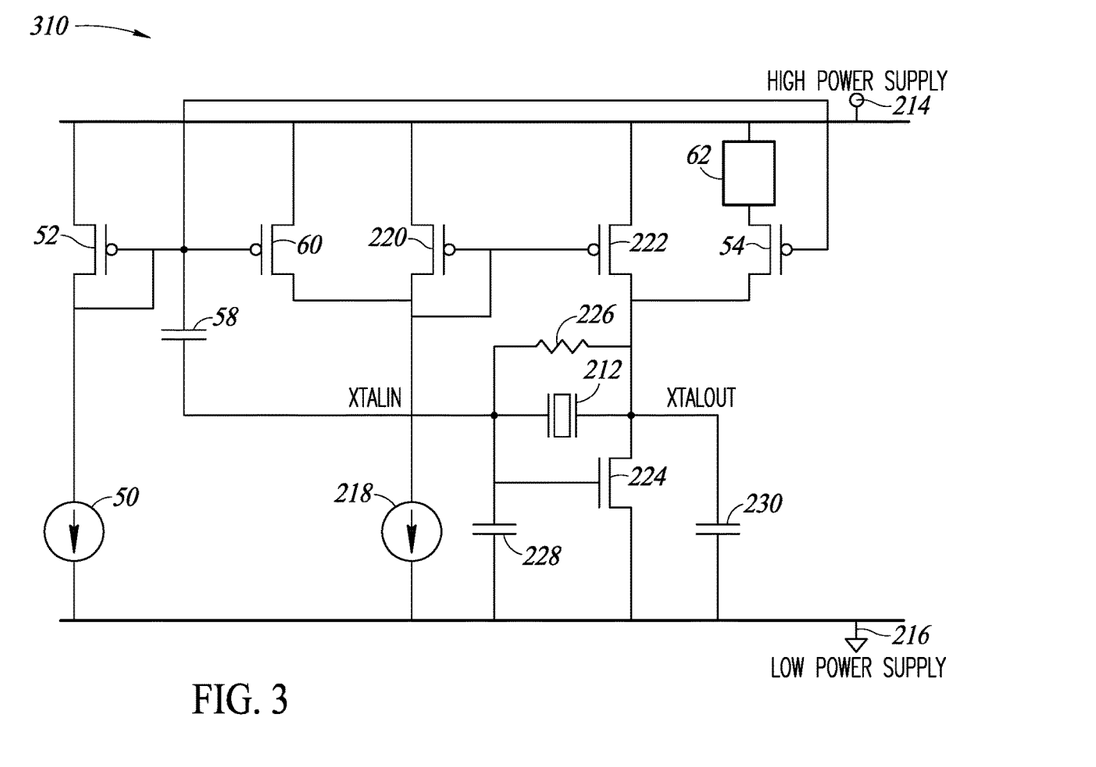
FIG. 3 shows a low power crystal oscillator circuit according to a second embodiment of the present disclosure.

FIG. 3 shows a low power crystal oscillator circuit 310 according to the second embodiment of the present disclosure. The low power crystal oscillator circuit 310 shown in FIG. 3 is similar in many relevant respects to the low power crystal oscillator circuit 310 shown in FIG. 2. Notably, the low power crystal oscillator circuit 310 shown in FIG. 3 includes a current limiting circuit 62 electrically coupled between the high power supply 214 and transistor 54. The current limiting circuit 62 limits the current flowing through the current mirror transistor 54, which prevents the transistor 54 from causing undesirable positive feedback. The current limiting circuit 62 may include any circuit configuration that limits the amount of current flowing from the high power source 214 to the current mirror transistor 54 to a predetermined value of-current.

Figure 4A:
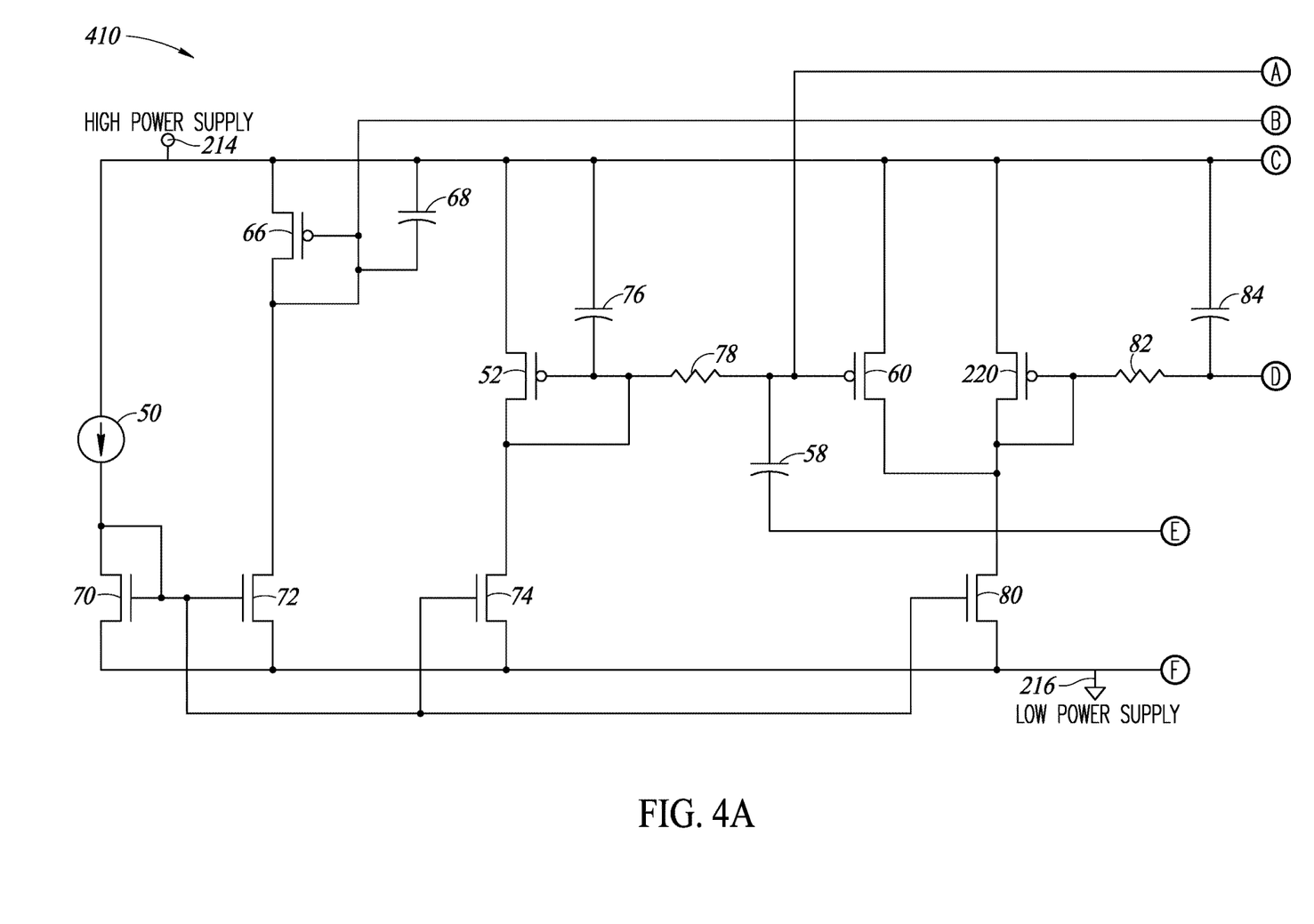
FIGS. 4A and 4B show another low power crystal oscillator circuit according to the second embodiment of the present disclosure.
Figure 4B:
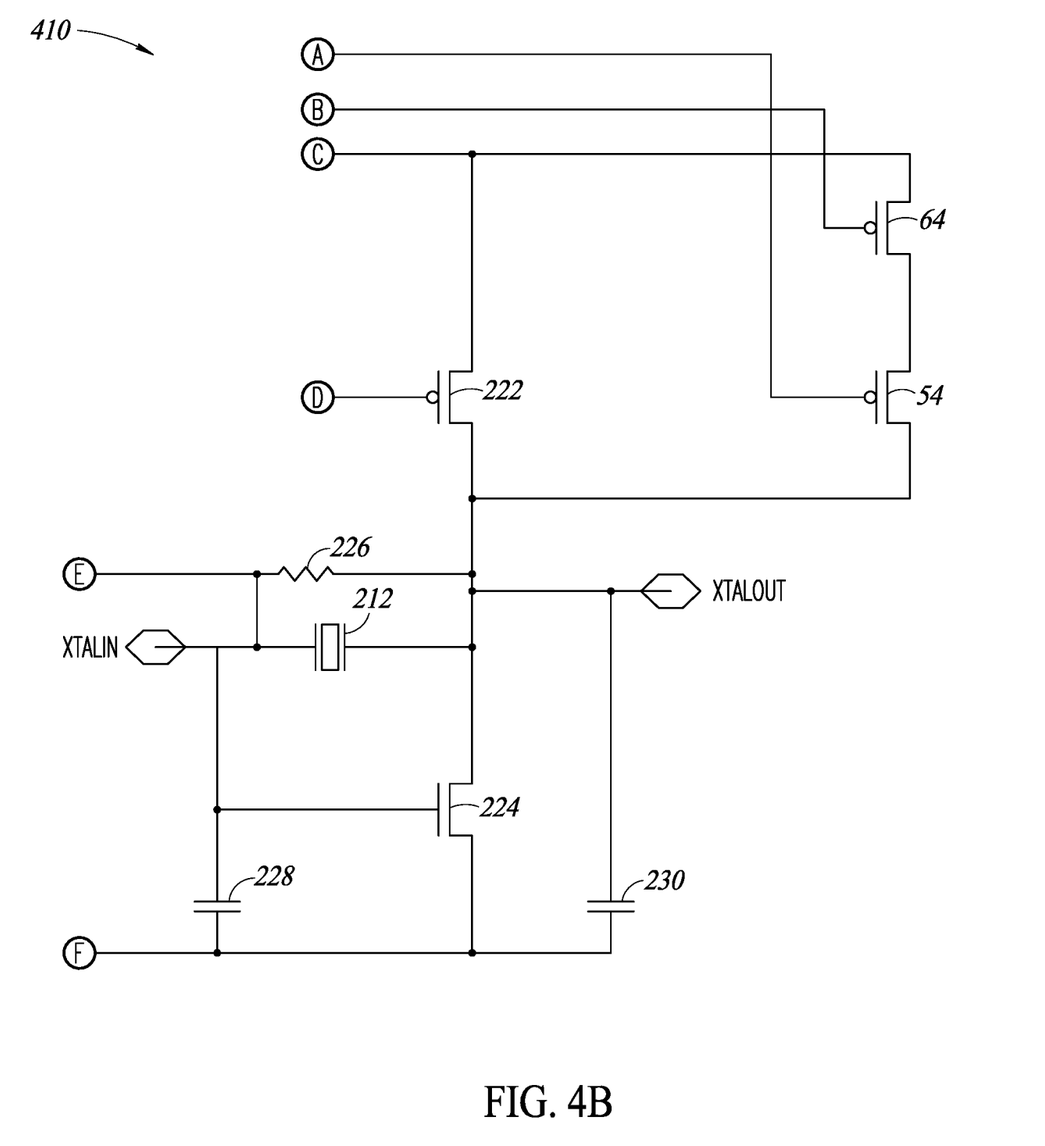

FIGS. 4A and 4B show a low power crystal oscillator circuit 410 according to the second embodiment of the present disclosure. The low power crystal oscillator circuit 410 shown in FIGS. 4A and 4B is similar in many relevant respects to the low power crystal oscillator circuit 310 shown in FIG. 3. Notably, the low power crystal oscillator circuit 410 shown in FIGS. 4A and 4B includes an example of a circuit configuration of the current limiting circuit 62 shown in FIG. 3.

More particularly, the low power crystal oscillator circuit 410 includes a current mirror transistor 64, a current mirror transistor 66, and current mirror transistors 70 and 72. The current mirror transistor 64 has a first terminal, a second terminal, and a gate terminal, wherein the first terminal of transistor 64 is electrically coupled to the high power supply 214 and the second terminal of transistor 64 is electrically coupled to the first terminal of current mirror transistor 54. The current mirror transistor 66 has a first terminal, a second terminal, and a gate terminal, wherein the first terminal of transistor 66 is electrically coupled to the high power supply 214, and the second terminal of transistor 66 is electrically coupled to the gate terminal of transistor 66, which is also electrically coupled to a first terminal of the capacitor 68. A second terminal of the capacitor 68 is electrically coupled to the high power supply 214.

The current mirror transistor 70 has a first terminal, a second terminal, and a gate terminal, wherein the first terminal of transistor 70 is electrically coupled to the current source 50, the second terminal of transistor 70 is electrically coupled to the low power supply 216, and the gate terminal of transistor 70 is electrically coupled to first terminal of transistor 70. The current mirror transistor 72 has a first terminal, a second terminal, and a gate terminal, wherein the first terminal of transistor 72 is electrically coupled to the second terminal of transistor 66, the second terminal of transistor 72 is electrically coupled to the low power supply 216, and the gate terminal of transistor 72 is electrically coupled to the gate terminal of transistor 72.

The amount of current passing through the current mirror transistor 72 is amplified from the current through current source 50 based on the ratio of the W/L of transistor 72 to the W/L of transistor 70. By making the W/L of transistor 72 the same as the W/L of transistor 70, the amount of current flowing through the current mirror transistors 72 and 66 can be the same as the current source 50. Of course, the W/L of transistor 72 could also be greater than or less than the W/L of transistor 70.

The amount of current passing through the current mirror transistor 64 is amplified from the current through current mirror transistor 66 based on the ratio of the W/L of transistor 64 to the W/L of transistor 66. By making the W/L of transistor 64 greater than the W/L of transistor 66, the amount of current flowing through the current mirror transistor 64 can be a multiple of the current through current mirror transistor 66. In various embodiments, it might be in the range of 2 to 200 times greater. For example, the W/L of transistor 64 is 5 times larger than the W/L of transistor 66. Because the current flowing through the current mirror transistor 64 is the current that flows through the current mirror transistor 54, the current that flows through the current mirror transistor 54 can be selected by appropriate selection of the ratio of the W/L of transistor 64 to the W/L of transistor 66.

The low power crystal oscillator circuit 410 further includes a current mirror transistor 74 having a first terminal, a second terminal, and a gate terminal, wherein the first terminal of transistor 74 is electrically coupled to the second terminal of transistor 52, the second terminal of transistor 74 is electrically coupled to the low power supply 216, and the gate terminal of transistor 74 is electrically coupled to the gate terminals of current mirror transistors 70 and 72. By making the W/L of transistor 74 the same as the W/L of transistor 70, the amount of current flowing through the current mirror transistors 74 can be the same as the current source 50. Of course, the W/L of transistor 74 could also be greater than the W/L of transistor 70. Because the current flowing through the current mirror transistor 74 is the current that flows through the current mirror transistor 52, the current that flows through the current mirror transistor 52 can be selected by appropriate selection of the ratio of the W/L of transistor 74 to the W/L of transistor 70.

The low power crystal oscillator circuit 410 further includes a capacitor 76 and a resistor 78. A first terminal of capacitor 76 is electrically coupled to the high power supply 214, and a second terminal of capacitor 76 is electrically coupled to the gate terminal of transistor 52. A first terminal of resistor 78 is also electrically coupled to the gate terminal of transistor 52, and a second terminal of resistor 78 is electrically coupled to the gate terminal of transistor 60.

The low power crystal oscillator circuit 410 further include a current mirror transistor 80 having a first terminal, a second terminal, and a gate terminal, wherein the first terminal of transistor 80 is electrically coupled to the second terminal of transistor 220, the second terminal of transistor 80 is electrically coupled to the low power supply 216, and the gate terminal of transistor 80 is electrically coupled to the gate terminals of transistors 70, 72, and 74. By making the W/L of transistor 80 greater than the W/L of transistor 70, the amount of current flowing through the current mirror transistors 80 can be greater than or less than the current source 50 by some selected amount. The W/L of transistor 80 can be less than, equal to, or greater than the W/L of each of transistors 70, 72, and 74. In various embodiments, it might be equal or in the range of 1 to 20 times greater. In various embodiments, the W/L of transistor 80 is equal to the W/L of each of transistors 70, 72, and 74. Because the current flowing through the current mirror transistor 80 is the current that flows through the current mirror transistor 220, the current that flows through the current mirror transistor 220 can be selected by appropriate selection of the ratio of the W/L of transistor 80 to the W/L of transistor 70.

When transistor 66 operates in its saturation or subthreshold region, transistor 64 can provide a maximum current depending on the ratio of transistor 64 versus transistor 66. When transistor 54 demands higher current, transistor 64 will go in its linear region and limit the maximum current flowing in that branch to a constant value, such as 5 nA, for example. Accordingly, the current mirror transistors 64 and 66 can be configured such that a selected maximum current (e.g., 5 nA) flows from the current mirror transistor 64 to the transistor 224 to provide transconductance for maintaining oscillation of the crystal 212.

The low power crystal oscillator circuit 410 further includes a resistor 82 and a capacitor 84. A first terminal of resistor 82 is electrically coupled to the gate terminal of transistor 220, and a second terminal of resistor 82 is electrically coupled to the gate terminal of transistor 222. A first terminal of capacitor 84 is electrically coupled to the high power supply 214, and a second terminal of capacitor 84 is electrically coupled to the gate terminal of transistor 222.

Figure 5A:
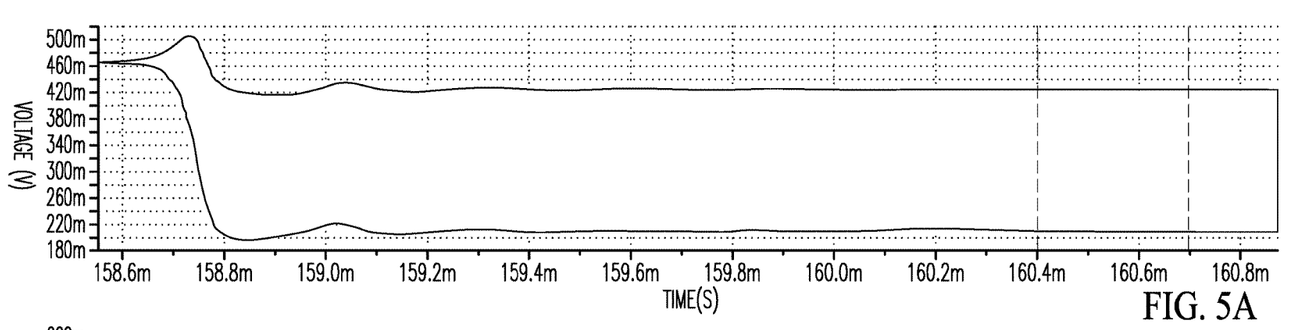
FIG. 5A-5F are various operational parameters of the low power crystal oscillator circuit shown in FIGS. 4A and 4B.
Figure 5B:
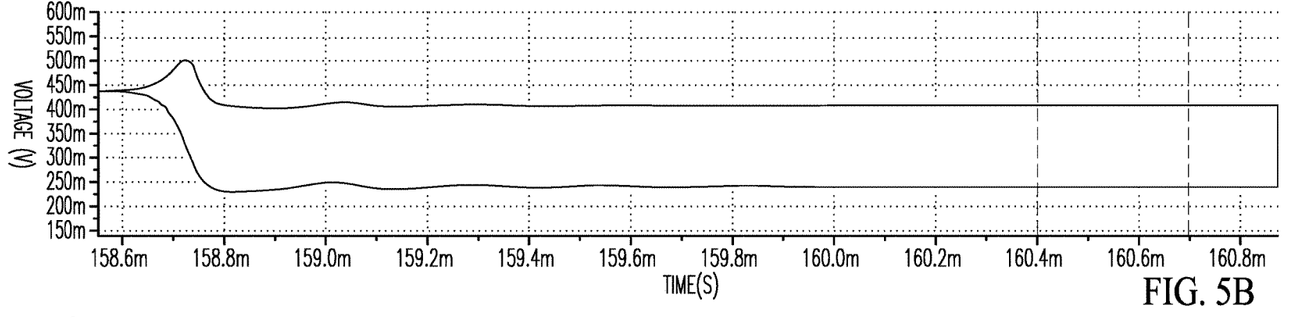
Figure 5C:
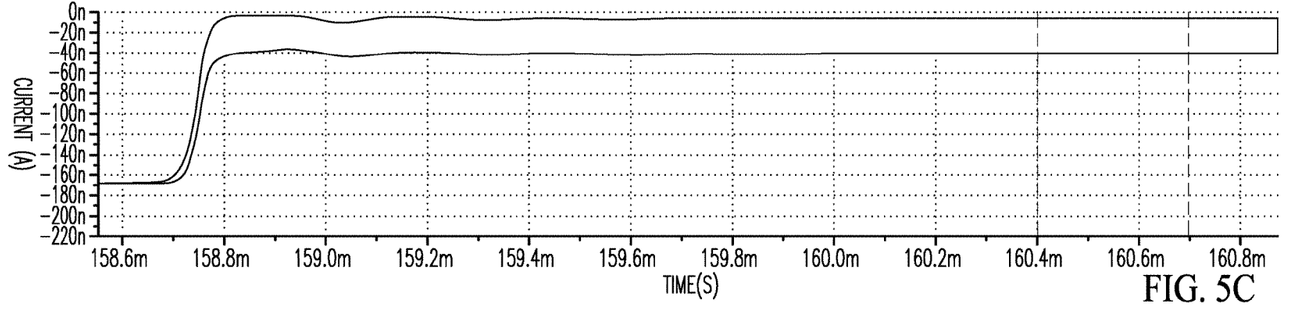
Figure 5D:
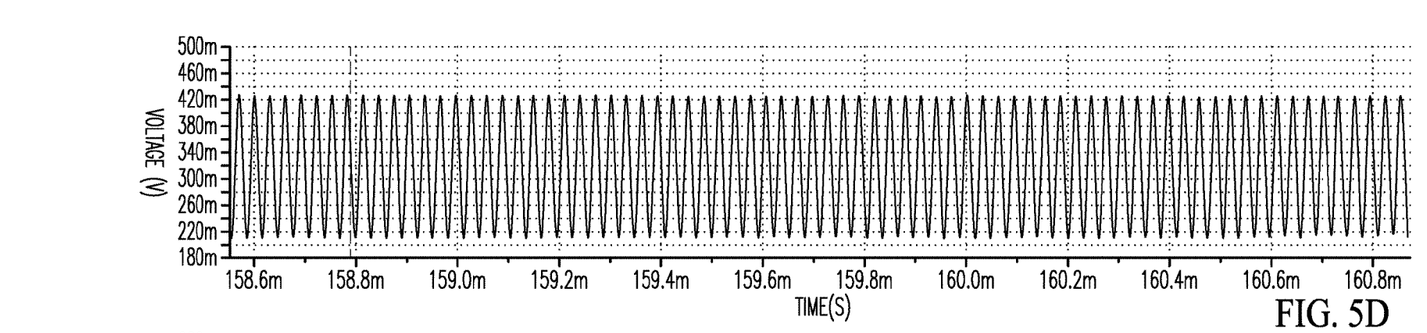
Figure 5E:
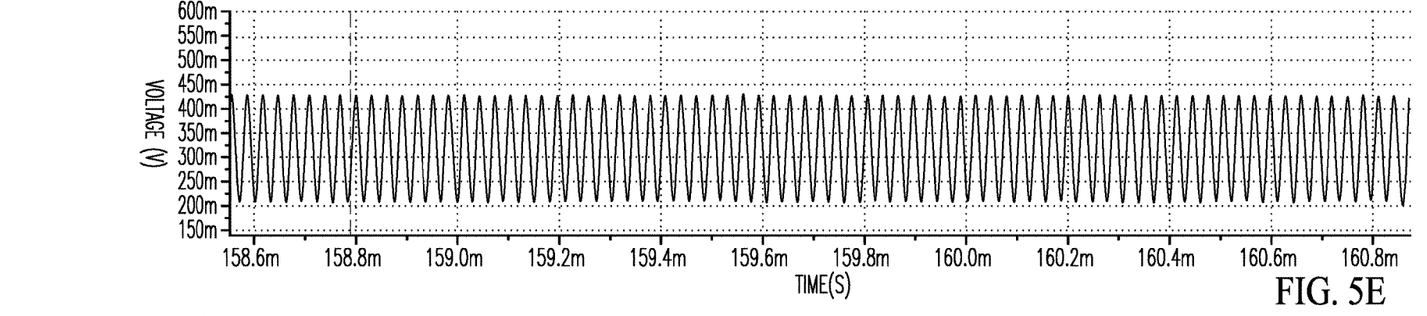
Figure 5F:
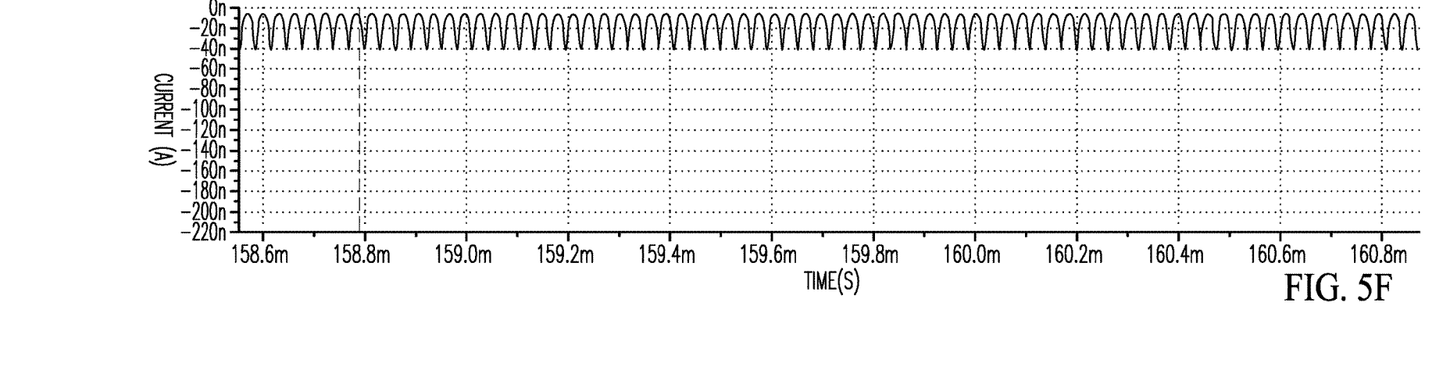

FIG. 5A-5F are various operational parameters of the low power crystal oscillator circuit 410 shown in FIGS. 4A and 4B. FIG. 5A shows a graph of voltage over time for the voltage at the input terminal XTALIN of the crystal 212. FIG. 5B shows a graph of voltage over time for the voltage at the output terminal XTALOUT of the crystal 212. FIG. 5C shows a graph of current over time for the current flowing through the positive power supply of the oscillator. FIG. 5D shows a zoomed-in portion of the graph shown in FIG. 5A. FIG. 5E shows a zoomed-in portion of the graph shown in FIG. 5B. FIG. 5F shows a zoomed-in portion of the graph shown in FIG. 5C.

As shown in FIG. 5A, the voltage at the input terminal XTALIN of the crystal 212 begins at about 469 mV. As shown in FIGS. 5A and 5D, after the crystal 212 is under stable oscillation, the peak-to-peak voltage swing of the voltage at the input terminal XTALIN of the crystal 212 is about 216 mV.

As shown in FIG. 5B, the voltage at the output terminal XTALOUT of the crystal 212 begins at about 468 mV. As shown in FIGS. 5B and 5E, after the crystal 212 is under stable oscillation, the peak-to-peak voltage of the voltage at the output terminal XTALOUT of the crystal 212 is about 224 mV.

As shown in FIG. 5C, the average current that initially flows through the positive power supply of the oscillator is about −169 nA. As shown in FIGS. 5C and 5F, after the crystal 212 is under stable oscillation, the average current flowing through the positive power supply of the oscillator is about −17.8 nA. Accordingly, when the crystal 212 is under stable oscillation, the current flowing through the transistor 224 is about one-tenth of the current that flows through the transistor 224 when the low power crystal oscillator circuit 410 starts operating. Thus, a reduction in power can be an order of magnitude, namely about 10 times from a startup operation mode to a standard operation mode.

Figure 6A:
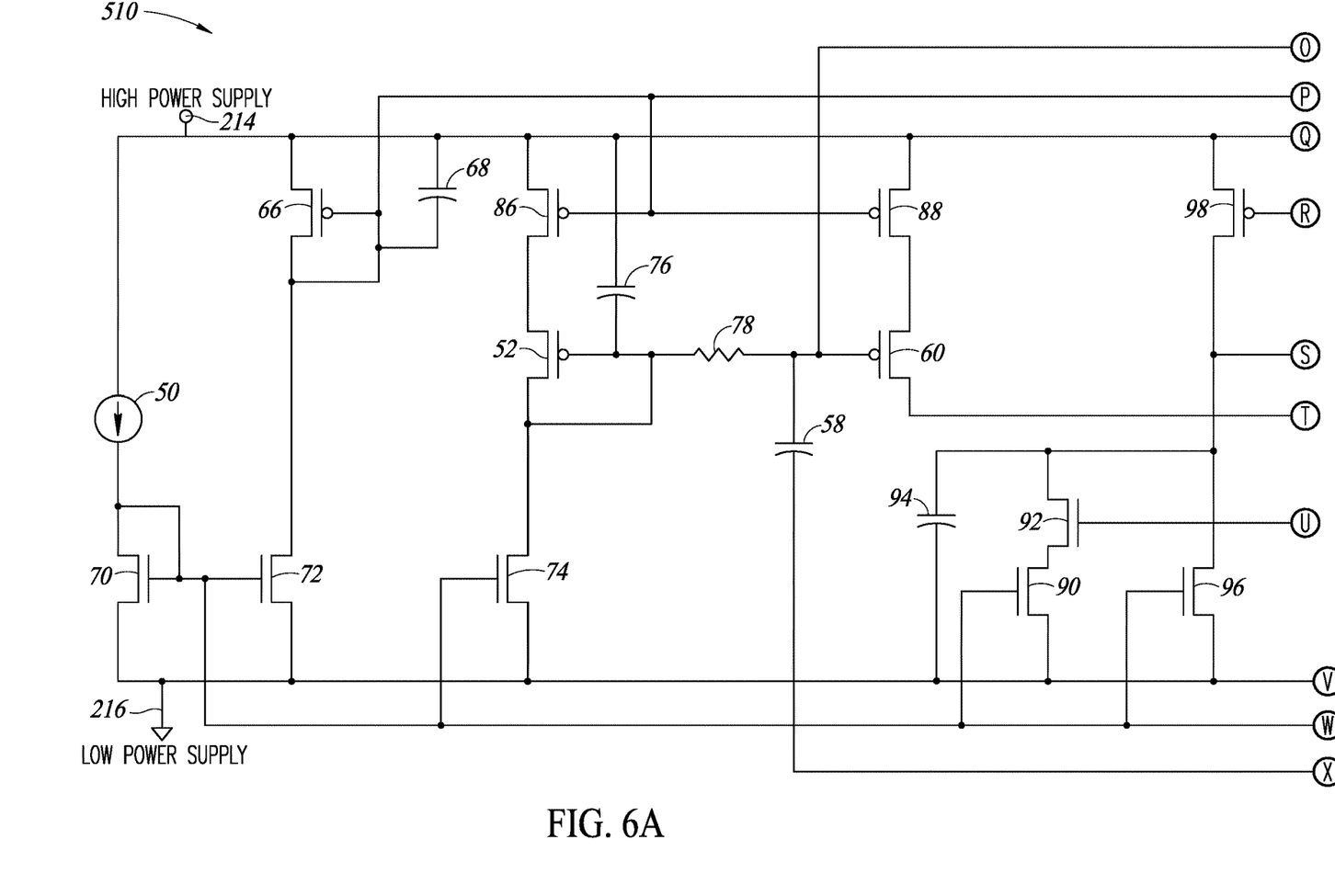
FIGS. 6A and 6B show a low power crystal oscillator circuit according to a third embodiment of the present disclosure.
Figure 6B:
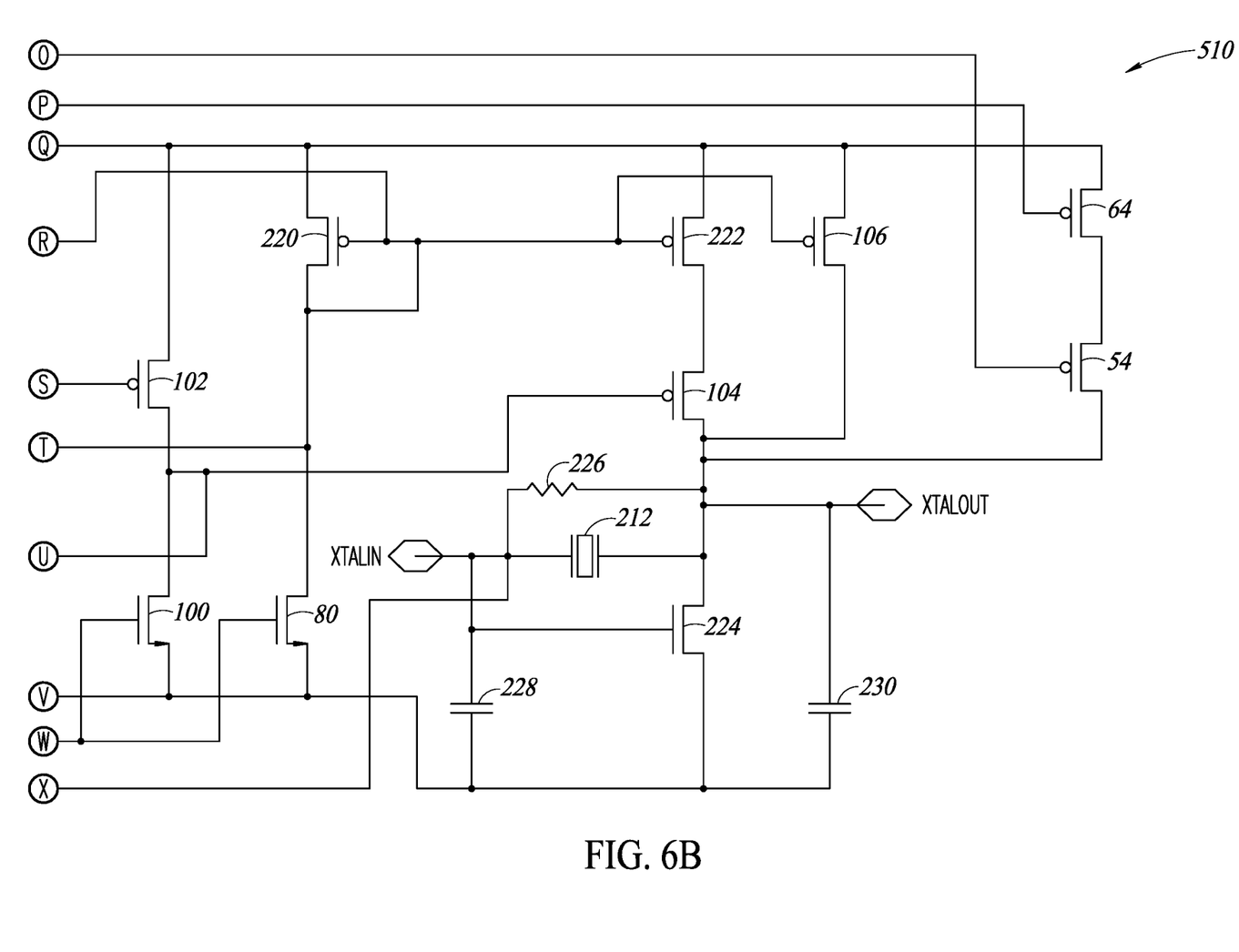

FIGS. 6A and 6B show a low power crystal oscillator circuit 510 according to a third embodiment of the present disclosure. The low power crystal oscillator circuit 510 shown in FIGS. 6A and 6B is similar in many relevant respects to the low power crystal oscillator circuit 410 shown in FIGS. 4A and 4B. Notably, the low power crystal oscillator circuit 510 shown in FIGS. 6A and 6B includes an amplitude detection circuit that turns on and off the current mirror transistor 222, which is biased by a relatively high current, when the amplitude of oscillation of the crystal 212 exceeds a threshold voltage level.

In one or more embodiments, low power crystal oscillator circuit 510 optionally includes a current mirror transistor 86 having a first terminal, a second terminal, and a gate terminal, wherein the first terminal of transistor 86 is electrically coupled to the high power supply 214, the second terminal of transistor 86 is electrically coupled to the first terminal of transistor 52, and the gate terminal of transistor 86 is electrically coupled to the gate terminal of current mirror transistor 66. The amount of current passing through the current mirror transistor 86 is amplified from the current through the current mirror transistor 72 based on the ratio of the W/L of current mirror transistor 86 to the W/L of transistor 66. By making the W/L of transistor 86 larger than the W/L of transistor 66, the amount of current passing through the current mirror transistor 86 can be larger than the current through the current mirror transistor 72 by some selected amount. In various embodiments, it might be in the range of 20 to 300 times greater. For example, the W/L of transistor 86 is 250 times larger than the W/L of transistor 66. In embodiments in which the low power crystal oscillator circuit 510 does not include the current mirror transistor 86, the drain of transistor 52 and the drain of transistor 60 are connected to the power supply.

The low power crystal oscillator circuit 510 further includes a current mirror transistor 88 having a first terminal, a second terminal, and a gate terminal, wherein the first terminal of transistor 88 is electrically coupled to the high power supply 214, the second terminal of transistor 88 is electrically coupled to the first terminal of transistor 60, and the gate terminal of transistor 88 is electrically coupled to the gate terminals of current mirror transistors 66 and 86. The amount of current passing through the current mirror transistor 88 is amplified from the current through the current mirror transistor 72 based on the ratio of the W/L of current mirror transistor 88 to the W/L of transistor 66. By making the W/L of transistor 88 larger than the W/L of transistor 66, the amount of current passing through the current mirror transistor 88 can be larger than the current through the current mirror transistor 72 by some selected amount. In various embodiments, it might be in the range of 2 to 20 times greater. For example, the W/L of transistor 84 is 4 times larger than the W/L of transistor 66.

The low power crystal oscillator circuit 510 further includes a current mirror transistor 90 having a first terminal, a second terminal, and a gate terminal, wherein the second terminal of transistor 90 is electrically coupled to the low power supply 216, and the gate terminal of transistor 90 is electrically coupled to the gate terminals of current mirror transistors 70, 72, and 74. The amount of current passing through the current mirror transistor 90 is amplified from the current through the current mirror transistor 70 based on the ratio of the W/L of current mirror transistor 90 to the W/L of transistor 70. By making the W/L of transistor 90 larger than the W/L of transistor 70, the amount of current passing through the current mirror transistor 90 can be larger than the current through the current mirror transistor 70 by some selected amount. In various embodiments, it might be in the range of 2 to 20 times greater. For example, the W/L of transistor 90 is 2 times larger than the W/L of transistor 70.

The low power crystal oscillator circuit 510 further includes a control transistor 92 and a capacitor 94. The control transistor 92 has a first terminal, a second terminal, and a gate terminal, wherein the second terminal of transistor 92 is electrically coupled to the first terminal of transistor 90. A first terminal of capacitor 94 is electrically coupled to the first terminal of transistor 92, and a second terminal of capacitor 94 is electrically coupled to the low power supply 216.

The low power crystal oscillator circuit 510 further includes a current mirror transistor 96 having a first terminal, a second terminal, and a gate terminal, wherein the first terminal of transistor 96 is electrically coupled to the first terminal of transistor 92, the second terminal of transistor 96 is electrically coupled to the low power supply 216, and the gate terminal of transistor 90 is electrically coupled to the gate terminals of current mirror transistors 70, 72, 74, and 90. The amount of current passing through the current source 50 will be amplified based on the ratio of the W/L of current mirror transistor 70 to the W/L of transistor 96. By making the W/L of transistor 96 the same as the W/L of transistor 70, the amount of current passing through the current mirror transistor 96 can be the same as the current through the current mirror transistor 70. Of course, the W/L of transistor 96 could also be greater than the W/L of transistor 70.

The low power crystal oscillator circuit 510 further includes a current mirror transistor 98 having a first terminal, a second terminal, and a gate terminal, wherein the first terminal of transistor 98 is electrically coupled to the high power supply 214, the second terminal of transistor 98 is electrically coupled to the first terminals of transistors 92 and 96, and the gate terminal of transistor 98 is electrically coupled to the gate terminal of transistor 220. The amount of current passing through the current mirror transistor 98 is amplified from the current through the current mirror transistor 220 based on the ratio of the W/L of current mirror transistor 98 to the W/L of transistor 220. By making the W/L of transistor 98 larger than the W/L of transistor 220, the amount of current passing through the current mirror transistor 98 can be larger than the current through the current mirror transistor 220 by some selected amount. In various embodiments, it might be in the range of 2 to 100 times larger. For example, the W/L of transistor 98 is 20 times larger than the W/L of transistor 220.

The low power crystal oscillator circuit 510 further includes a current mirror transistor 100 having a first terminal, a second terminal, and a gate terminal, wherein the second terminal of transistor 100 is electrically coupled to the low power supply 216, and the gate terminal of transistor 100 is electrically coupled to the gate terminals of current mirror transistors 70, 72, 74, 90, and 96. The amount of current passing through the current source 50 will be amplified based on the ratio of the W/L of current mirror transistor 70 to the W/L of transistor 100. By making the W/L of transistor 100 the same as the W/L of transistor 70, the amount of current passing through the current mirror transistor 100 can be the same as the current through the current mirror transistor 70. Of course, the W/L of transistor 100 could also be less than or greater than the W/L of transistor 70.

The low power crystal oscillator circuit 510 further includes a control transistor 102 having a first terminal, a second terminal, and a gate terminal, wherein the first terminal of control transistor 102 is electrically coupled to the high power supply 214, the second terminal of control transistor 102 is electrically coupled to the first terminal of current mirror transistor 100, and the gate terminal of control transistor 102 is electrically coupled to the second terminal of current mirror transistor 98 and the first terminal of current mirror transistor 96. In one or more implementations, the W/L of control transistor 102 is independent of the W/L of transistor 70.

The low power crystal oscillator circuit 510 further includes a control transistor 104 having a first terminal, a second terminal, and a gate terminal, wherein the first terminal of transistor 104 is electrically coupled to the second terminal of transistor 222, the second terminal of transistor 104 is electrically coupled to the output terminal XTALOUT of the crystal 212, and the gate terminal of transistor 104 is electrically coupled to the second terminal of transistor 102, the first terminal of transistor 100, and the gate terminal of transistor 92. In one or more implementations, the W/L of control transistor 104 is independent of the W/L of transistor 70.

The low power crystal oscillator circuit 510 further includes a current mirror transistor 106 having a first terminal, a second terminal, and a gate terminal, wherein the first terminal of transistor 106 is electrically coupled to the high power supply 214, the second terminal of transistor 106 is electrically coupled to the second terminal of control transistor 104, and the gate terminal of transistor 106 is electrically coupled to the gate terminals of current mirror transistors 220 and 222. The amount of current passing through the current mirror transistor 106 is amplified from the current through the current mirror transistor 220 based on the ratio of the W/L of current mirror transistor 106 to the W/L of transistor 220. By making the W/L of transistor 106 larger than the W/L of transistor 220, the amount of current passing through the current mirror transistor 106 can be larger than the current through the current mirror transistor 220 by some selected amount. In various embodiments, it might be in the range of 20 to 120 times larger. For example, the W/L of transistor 106 and the W/L of transistor 222 is 100 times larger than the W/L of transistor 220.

In one or more implementations, the current flowing through current mirror transistor 60 is initially 200 pA and the current flowing through current mirror transistor 220 is equal to 800 pA, which is 1 nA-200 pA. The current flowing through current mirror transistor 98 is 1.6 nA. The current flowing through current mirror transistor 96 is 1 nA. Accordingly, the voltage of the high power supply 214 is provided to the gate terminal of control transistor 102, which causes the control transistor 102 to switch off. The current flowing through current mirror transistor 100 is 1 nA, which causes the control transistor 104 to be switched on and causes transistor 92 to be switched off.

As operation continues, the current flowing through the current mirror transistor 60 increases, which reduces the current flowing through the current mirror transistor 220. The current flowing through the current mirror transistor 220 is copied and multiplied in the current mirror transistor 98. When the current flowing through current mirror transistor 98 falls below 1 nA, the control transistor 102 switches on. The 1 nA current flowing through the current mirror transistor 96 then causes the control transistor 104 to be switched off and causes transistor 92 to be switched on. Accordingly, the current mirror transistor 222 no longer provides current to the transistor 224 for driving the crystal 212. Also, current starts flowing in the transistors 90 and 92.

As operation continues, if the amplitude of the voltage oscillation of the crystal 212 reduces, the current flowing through the current mirror transistor 220 starts to increase. When the current flowing through current mirror transistor 220 begins to rise, the current flowing through the current mirror transistor 98 also begins to rise. When the current flowing through the current mirror transistor 98 exceeds the current produced by the current mirror transistors 90 and 96, the control transistor 102 switches off. The current flowing through the current mirror transistor 100 then causes the control transistor 104 to switch on and the transistor 92 to switch off. Accordingly, the current mirror transistor 222 once again provides current to the transistor 224 for driving the crystal 212. The current mirror transistors 90, 92, and 96 provide hysteresis so that the transistor 102 and, thus, the transistor 104 has different threshold voltage thresholds for turning on and off.

Accordingly, the transistors 90, 92, 96, 98, 100, 102, 104, and 106, and the capacitor 94 form an amplitude detection circuit that enables the low power crystal oscillator circuit 510 to turn off the current mirror transistor 222, which is biased by a relatively high current, when the amplitude of oscillation of the crystal 212 exceeds a first threshold. Thus, the low power crystal oscillator circuit 510 can achieve even higher power savings. Additionally, the amplitude detection circuit enables the low power crystal oscillator circuit 510 to turn the current mirror transistor 222 back on when the amplitude of oscillation of the crystal 212 drops below a second threshold. Thus, the low power crystal oscillator circuit 510 maintains oscillation of the crystal 212.

The various embodiments described above can be combined to provide further embodiments. For example, some of the transistors are shown in the drawings as PMOS transistors; however, NMOS transistors may be used for those transistors without departing from the scope of the present disclosure.

All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low power crystal oscillator circuit, comprising:
a crystal;
a high power supply;

a low power supply;

a first capacitor having a first terminal coupled to the crystal;

a second capacitor having a first terminal coupled to the crystal;

a first current mirror transistor having a first terminal coupled to the high power supply, and a second terminal coupled to a gate terminal, the first current mirror transistor having a channel with a first width to length ratio;

a first current source configured to output a current of a first value, the first current source having a first terminal coupled to the second terminal of the first current mirror transistor;

a second current mirror transistor having a first terminal coupled to the high power supply, a gate terminal coupled to the gate terminal of the first current mirror transistor, a second terminal coupled to the crystal, and the second current mirror transistor having a second width to length ratio that is X times greater than the first width to length ratio;

a third current mirror transistor having a first terminal coupled to the high power supply and a second terminal coupled to a gate terminal of the third current mirror transistor, the third current mirror transistor having a third width to length ratio;

a second current source configured to output a current of a second value, the second current source having a first terminal coupled to the second terminal of the third current mirror transistor;

a fourth current mirror transistor having a first terminal coupled to the high power supply, a gate terminal coupled to the gate terminal of the third current mirror transistor, and a second terminal coupled to the second terminal of the second current mirror transistor, the fourth current mirror transistor having a fourth width to length ratio that is Y times greater than the third width to length ratio; and a fifth current mirror transistor having a first terminal coupled to the high power supply, a gate terminal coupled to the gate terminals of the third current mirror transistor and the fourth current mirror transistor, and a second terminal coupled to the second terminal of the first current mirror transistor, the fifth current mirror transistor having a fifth width to length ratio that is Z times smaller than the third width to length ratio, the gate terminals of the third current mirror transistor, the fourth current mirror transistor, and the fifth current mirror transistor are coupled to the crystal.

2. The low power crystal oscillator circuit of claim 1, further comprising:

a third capacitor having a first terminal coupled to an input terminal of the crystal and a second terminal coupled to the gate terminals of the third current mirror transistor, the fourth current mirror transistor, and the fifth current mirror transistor, the first capacitor having a second terminal coupled to the low power supply, the second capacitor having a second terminal coupled to the low power supply, the current of the second value being less than the current of the first value, the first current source having a second terminal coupled to the low power supply, the second current source having a second terminal coupled to the low power supply.

3. The low power crystal oscillator circuit of claim 1, further comprising:

a current limiting circuit coupled between the high power supply and the first terminal of the fourth current mirror transistor, the current limiting circuit limiting current that flows from the high power supply to the first terminal of the fourth current mirror transistor to a third value, the current of the third value being less than the current of the first value.

4. The low power crystal oscillator circuit of claim 1 wherein X is greater than 200.

5. The low power crystal oscillator circuit of claim 1 wherein Y is greater than 2.

6. The low power crystal oscillator circuit of claim 5 wherein Z is greater than 3.

7. A low power crystal oscillator circuit, comprising a crystal having an input terminal and an output terminal;

a high power supply;

a low power supply;

a first capacitor coupled to the input terminal of the crystal;

a second capacitor coupled to the output terminal of the crystal;

a first current mirror transistor coupled to the high power supply;

a first current source configured to output a current of a first value, the first current source coupled to the first current mirror transistor;

a second current mirror transistor coupled to the high power supply and the first current mirror transistor;

a third current mirror transistor coupled to the high power supply;

a second current source configured to output a current of a second value less than the first value, the second current source coupled to the third current mirror transistor;

a fourth current mirror transistor coupled to the third current mirror transistor and the second current mirror transistor;

a fifth current mirror transistor coupled to the high power supply, the third current mirror transistor, the fourth current mirror transistor, and first current mirror transistor; and a third capacitor coupled to the input terminal of the crystal and coupled to gate terminals of the third current mirror transistor, the fourth current mirror transistor, and the fifth current mirror transistor, the gate terminals of the third current mirror transistor, the fourth current mirror transistor, and the fifth current mirror transistor are coupled to the input terminal of the crystal; and a sixth current mirror transistor coupled to the high power supply;

a third current source outputting current of a third value that is less than the first value, the third current source coupled to the sixth current mirror transistor; and a seventh current mirror transistor coupled to the high power supply, a gate terminal coupled to a gate terminal of the sixth current mirror transistor, and a second terminal coupled to a first terminal of the fourth current mirror transistor.

8. The low power crystal oscillator circuit of claim 7 wherein a width to length ratio of the second current mirror transistor is greater than a width to length ratio of the first current mirror transistor.

9. The low power crystal oscillator circuit of claim 7 wherein a width to length ratio of the fourth current mirror transistor is greater than a width to length ratio of the third current mirror transistor.

10. The low power crystal oscillator circuit of claim 9 wherein a width to length ratio of the second current mirror transistor is less than the width to length ratio of the third current mirror transistor.

11. The low power crystal oscillator circuit of claim 9, further comprising:
a fourth capacitor having a first terminal coupled to the gate terminal of the sixth current mirror transistor and a second terminal coupled to the high power supply.

12. The low power crystal oscillator circuit of claim 7 wherein the second value is equal to the third value.

13. A low power crystal oscillator circuit, comprising:
a crystal;
a high power supply;
a low power supply;
a first capacitor coupled between the crystal and the low power supply;
a second capacitor coupled between the crystal and the low power supply;
a first current mirror transistor coupled to the high power supply;
a first current source of a first value coupled to the first current mirror transistor;
a second current mirror transistor coupled to the high power supply and to the first current mirror transistor;
a third current mirror transistor coupled to the high power supply and the first current mirror transistor;
a second current source of a second value that is less than the first value, the second current source coupled to the third current mirror transistor;
a fourth current mirror transistor coupled to the first current mirror transistor;
a first control transistor coupled to the high power supply, the third current mirror transistor, and a second terminal;
a third current source outputting current of a third value that is less than the first value, the third current source coupled to the first control transistor and the low power supply; and
a second control transistor coupled to the second current mirror transistor, the first control transistor, an output terminal of the crystal, and the fourth current mirror transistor.

14. The low power crystal oscillator circuit of claim 13 wherein the second value is equal to the third value.

15. The low power crystal oscillator circuit of claim 13, further comprising:
a fifth current mirror transistor having a first terminal coupled to the high power supply, a gate terminal, and a second terminal coupled to the gate terminal;
a fourth current source outputting current of a fourth value, the fourth current source having a first terminal coupled to the second terminal of the fifth current mirror transistor and a second terminal coupled to the low power supply, the current of the fourth value being less than the current of the first value; and
a sixth current mirror transistor having a first terminal, a gate terminal coupled to the gate terminal of the fifth current mirror transistor, and a second terminal coupled to the second terminal of the output terminal of the crystal.

16. The low power crystal oscillator circuit of claim 15, further comprising:
a seventh current mirror transistor having a first terminal coupled to the high power supply, a gate terminal coupled to the gate terminals of the fifth current mirror transistor and the sixth current mirror transistor, a second terminal coupled to the second terminal of the first current mirror transistor,
wherein the gate terminals of the fifth current mirror transistor, the sixth current mirror transistor, and the seventh current mirror transistor are coupled to an input terminal of the crystal.

17. The low power crystal oscillator circuit of claim 16, further comprising:
a third capacitor having a first terminal coupled to the input terminal of the crystal and a second terminal coupled to the gate terminals of the fifth current mirror transistor, the sixth current mirror transistor, and the seventh current mirror transistor.

18. The low power crystal oscillator circuit of claim 16, further comprising:
an eighth current mirror transistor having a first terminal coupled to the high power supply, a gate terminal, and a second terminal coupled to the gate terminal;
a fifth current source outputting current of a fifth value, the fifth current source having a first terminal coupled to the second terminal of the eighth current mirror transistor and a second terminal coupled to the low power supply, the current of the fifth value being less than the current of the first value; and
a ninth current mirror transistor having a first terminal coupled to the high power supply, a gate terminal coupled to the gate terminal of the fifth current mirror transistor, and a second terminal coupled to the first terminal of the sixth current mirror transistor.

19. The low power crystal oscillator circuit of claim 18, further comprising:
a tenth current mirror transistor having a first terminal coupled to the high power supply, a gate terminal coupled to the gate terminal of the eighth current mirror transistor, and a second terminal coupled to the first terminal of the fifth current mirror transistor; and
an eleventh current mirror transistor having a first terminal coupled to high power supply, a gate terminal coupled to the gate terminal of the eighth current mirror transistor, and a second terminal coupled to the first terminal of the seventh current mirror transistor.

* * * * *